US009015219B2

(12) United States Patent  (10) Patent No.: US 9,015,219 B2
Bal et al.  (45) Date of Patent: Apr. 21, 2015

(54) APPARATUS FOR SIGNAL PROCESSING

(75) Inventors: Ankur Bal, Greater Noida (IN); Anupam Jain, New Delhi (IN); Neha Bhargava, Greater Noida (IN)

(73) Assignee: STMicroelectronics International N.V., Amsterdam (NL)

(*) Notice: Subject to any disclaimer, the term of this patent is extended or adjusted under 35 U.S.C. 154(b) by 449 days.

(21) Appl. No.: 13/468,924

(22) Filed: May 10, 2012

(65) Prior Publication Data

US 2013/0110898 A1  May 2, 2013

(30) Foreign Application Priority Data

Oct. 28, 2011  (IN) ............................ 3074/DEL/2011

(51) Int. Cl.
*G06F 17/10* (2006.01)
*H03H 17/06* (2006.01)
(52) U.S. Cl.
CPC ................................. *H03H 17/0664* (2013.01)
(58) Field of Classification Search
None
See application file for complete search history.

(56) References Cited

U.S. PATENT DOCUMENTS

| | | | |
|---|---|---|---|
| 5,566,101 | A | 10/1996 | Kodra |
| 5,729,483 | A | 3/1998 | Brown |
| 6,041,339 | A | 3/2000 | Yu et al. |
| 6,618,739 | B1 | 9/2003 | Gonikberg et al. |
| 6,665,695 | B1 | 12/2003 | Brokish et al. |
| 7,698,355 | B2 * | 4/2010 | Bhuvanagiri et al. ......... 708/313 |

OTHER PUBLICATIONS

Singh et al, "Design and Implementation of CIC Based Decimation Filter for Improved Frequency Response," Emerging Trends in Electronic and Photonic Devices & Systems; Dec. 2009; Abstract only; retrieved from Internet Oct. 2, 2014; 1 page.
Kim et al., "A New Dynamic Decimation Filter Using Polyphase MACs for Medical Ultrasound Imaging," Ultrasonics Symposium; Nov. 2008; Abstract only; retrieved from Internet Oct. 2, 2014; 1 page.
Zanjani et al., "Algorithmic Design of High-Precision Low-Power Multi-Stage Decimation Filters," Circuits and Systems, 49th IEEE International Midwest Symposium; vol. 2; Aug. 2006; Abstract only; retrieved from the Internet Oct. 2, 2014; 2 pages.
Yi et al, "Low-Power Area-Efficient Decimation Filters in Sigma-Delta ADCs," Electron Devices and Solid-State Circuits, Dec. 2007; Abstract only; retrieved from the Internet Oct. 2, 2014; 2 pages.

(Continued)

*Primary Examiner* — Michael D Yaary
(74) *Attorney, Agent, or Firm* — Allen, Dyer, Doppelt, Milbrath & Gilchrist, P.A.

(57) ABSTRACT

A signal processor includes one or more memory banks, wherein each memory bank stores filter coefficients; and one or more coefficient multiplexer units; each coefficient multiplexer unit being associated with a memory bank, and retrieves a filter coefficient based on a number of received input samples. The processor includes one or more multiply and accumulate (MAC) units, each MAC unit being associated with a coefficient multiplexer unit and determines a product of the retrieved filter coefficient with an input sample; retrieves a previous value stored in an associated register; computes a summation of the previous value and the product; and stores the summation in the associated register. The processor includes an output multiplexer unit to select a register, and to provide a value stored in the register as an output.

18 Claims, 4 Drawing Sheets

(56) References Cited

OTHER PUBLICATIONS

Zanjani et al., "A Comparative Study and Design of Decimation Filter for High-Precision Audio Data Converters," Microelectronics; Dec. 2005; Abstract only; retrieved from the Internet Oct. 2, 2014; 1 page.

Nerurkar et al., "Low Power Sigma Delta Decimation Filter," Circuits and Systems, 45th Midwest Symposium; vol. 1; Aug. 2002; Abstract only; retrieved from the Internet Oct. 2, 2014; 1 page.

Grayver et al., "Low Power, Area Efficient Programmable Filter and Variable Rate Decimator," Circuits and Systems; 2000 IEEE International Symposium; vol. 5: May 2000; Abstract only; retrieved from the Internet Oct. 2, 2014; 2 pages.

* cited by examiner

APPARATUS FOR SIGNAL PROCESSING

RELATED APPLICATION INFORMATION

This application is a translation of and claims the priority benefit of India patent application number 3074/DEL/2011, filed on Oct. 28, 2011, entitled "Apparatus for Signal Processing", which is hereby incorporated by reference to the maximum extent allowable by law.

FIELD OF THE INVENTION

The present subject matter relates to digital signal processing and, particularly but not exclusively, to multi rate signal processing.

BACKGROUND OF THE INVENTION

A finite impulse response (FIR) filter is a type of a signal processing filter having an impulse response of finite duration. The impulse response of an Nth-order discrete-time FIR filter lasts for N+1 input samples, and then dies to zero. The FIR filter requires no feedback and thus, is inherently stable. Further, the FIR filter can also be easily configured to operate in a linear phase by making the coefficient sequence of the FIR filter symmetric, and is therefore used for various phase-sensitive applications, for example, data communications, crossover filters, and mastering of audio signal. In general, the FIR filter is widely used in various electronic appliances, such as audio devices, signal processors, sound digitization systems, and simulators.

The characteristics of an FIR filter are typically indicated by one or more taps. A tap refers to a coefficient/delay pair. The number of FIR taps, usually represented by N, is indicative of the memory space required to implement the FIR filter and the number of computations required. In general, a higher number of taps is indicative of greater stopband attenuation, less ripple in the output signal, etc. Every tap of the FIR filter is associated with a multiply and accumulate (MAC) operation. The MAC operation refers to the operation of multiplying a coefficient by the corresponding delayed input sample and accumulating the result.

The computational efficiency and the ease of implementation facilitate the FIR filter to be implemented in various signal processing applications. Generally, the FIR filter is better suited for multi-rate applications, such as downsampling, decimation, and interpolation, as the FIR filter is computationally more efficient than an infinite impulse response (IIR) filter.

Downsampling is the process of reducing the sampling rate of a signal, usually to reduce the data rate or the size of the data. The downsampling factor, conventionally denoted by K, may be an integer or a rational fraction greater than unity. For example, if an audio signal at 44,100 Hz is downsampled by a factor of two, the frequency changes to 22,050 Hz, and the bit rate is reduced to half, from 1,411,200 bit/s to 705,600 bit/s, assuming that each sample has a size of 16 bits and the size of the each sample remains unchanged.

Since downsampling reduces the sampling rate, most implementations of downsampling ensure compliance with the Shannon-Nyquist sampling theorem so as to avoid aliasing. Conventionally, decimation is used to ensure compliance with the sampling theorem. In decimation, a low-pass filter is used as an anti-aliasing filter to reduce the bandwidth of the signal before the signal is downsampled. Thus, decimation is a two-step process that includes passing a signal through the anti-aliasing filter and then downsampling the signal using the FIR filter.

SUMMARY OF THE INVENTION

This summary is provided to introduce concepts related to multi rate signal processing and the concepts are further described below in the detailed description. This summary is neither intended to identify essential features of the claimed subject matter nor is it intended for use in determining or limiting the scope of the claimed subject matter.

In an embodiment, a method includes storing a plurality of filter coefficients in a plurality of memory banks based in part on at least one of a decimation factor, number of filter coefficients, and number of system clock cycles per input sample time period; selecting a filter coefficient from amongst each of the plurality of memory banks based on a number of input samples; and computing the product of the selected filter coefficient with a received input sample. The method further comprises selecting a register based in part on at least one of the number of input samples and a number of output samples, wherein the selected register stores the value of a future output sample; retrieving a previous value stored in the selected register; determining a summation of the previous value and the computed product; and storing the summation in the selected register. The method further comprises controlling the association of each of the one or more memory banks with a multiply and accumulate (MAC) unit based in part on at least one of a number of input samples, a number of output samples, and a number of system clock cycles.

In accordance with another embodiment of the present subject matter, the apparatus for signal processing comprises one or more memory banks, wherein each memory bank is configured to store a plurality of filter coefficients; and one or more coefficient multiplexer units, each coefficient multiplexer unit being associated with a memory bank from amongst the one or more memory banks, wherein the each coefficient multiplexer unit is configured to retrieve a filter coefficient from amongst the plurality of filter coefficients stored in the associated memory bank, based in part on a number of received input samples. The apparatus further comprises one or more multiply and accumulate (MAC) units, each MAC unit being associated with a coefficient multiplexer unit from amongst the one or more coefficient multiplexer units and with one or more registers from amongst a plurality of registers, wherein the each MAC unit is configured to determine a product of the retrieved filter coefficient with an input sample; retrieve a previous value stored in an associated register selected from the one or more registers; compute a summation of the previous value and the product of the retrieved filter coefficient with the input sample; and store the summation in the associated register. In one implementation, the apparatus further comprises an output multiplexer unit configured to select a register from amongst the plurality of registers, based on at least one of the number of input samples and a number of output samples; and provide a value stored in the register as an output.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

Typically, a FIR filter is used to implement various techniques of signal processing, such as downsampling, decimation, and interpolation. The output of the FIR filter is a weighted sum of a finite number of input samples. For example, if the output of the FIR filter is represented by y[n], the present input sample is x[n], and the number of taps in the filter is N, then equation 1 depicts the relation between the output of the FIR filter and the input samples.

$$y[n] = \sum_{i=0}^{N-1} x[n-i]c_i \qquad \text{Equation 1}$$

In the equation 1, $c_0, c_1, \ldots, c_{N-1}$, represent the coefficients of the FIR filter. Thus, the output of the FIR filter is dependent on a current input sample, denoted by x[n] and the previous N−1 input samples. If the decimation factor of the filter is K, then for every K input samples, the FIR filter will generate an output. For example, if the FIR filter has a decimation factor of 5, then for every 5 input samples, the FIR filter would produce an output.

Based on equation 1, it may be observed that the output of the FIR filter follows a pattern. For example, if the FIR filter has 20 taps, i.e., 20 filter coefficients, then the first coefficient $c_0$ would be multiplied with every fifth input sample, the second coefficient $c_1$ would be multiplied by the fourth, ninth, fourteenth and nineteenth input samples, and so on. Based on the pattern, in one conventionally known technique, the coefficients of the FIR filter are stored in one or more memory banks. As an illustration, consider the FIR filter of the above example having 20 taps, i.e., 20 filter coefficients, and a decimation factor of 5, accordingly, the number of memory banks, represented by M, would be (N/K), i.e., 4. Thus each memory bank would have (N/M) filter coefficients, i.e., 5 memory coefficients.

For the ease of explanation, consider one more example of a FIR filter having 12 taps and a decimation factor of 4. Since the decimation factor is 4, the FIR filter will generate an output for every four input signals. Further, since the number of taps is 12, a maximum of 11 previous input samples and the current input sample would be considered for generating the output. Thus, in accordance with equation 1, the first output of the FIR filter is y[3], as represented by equation 2 and the second output of the FIR filter 100 is y[7], as is represented by equation 3.

$$y[3] = x[0]c_3 + x[1]c_2 + x[2]c_1 + x[3]c_0 \qquad \text{Equation 2}$$

$$y[7] = x[0]c_7 + x[1]c_6 + x[2]c_5 + x[3]c_4 + x[4]c_3 + x[5]c_2 + x[6]c_1 + x[7]c_0 \qquad \text{Equation 3}$$

As stated earlier, a pattern is observed in the coefficient with which an input sample is multiplied. For example, every fourth input sample is always multiplied by the first, fifth or ninth filter coefficient, i.e., by $c_0$, $c_4$, and $c_8$. Based on the pattern, in one conventional approach the design of the memory bank is modified to achieve faster computation and to reduce number of components of the FIR filter. The conventional approach is explained herein with help of FIG. 1(a).

Figure 1A:
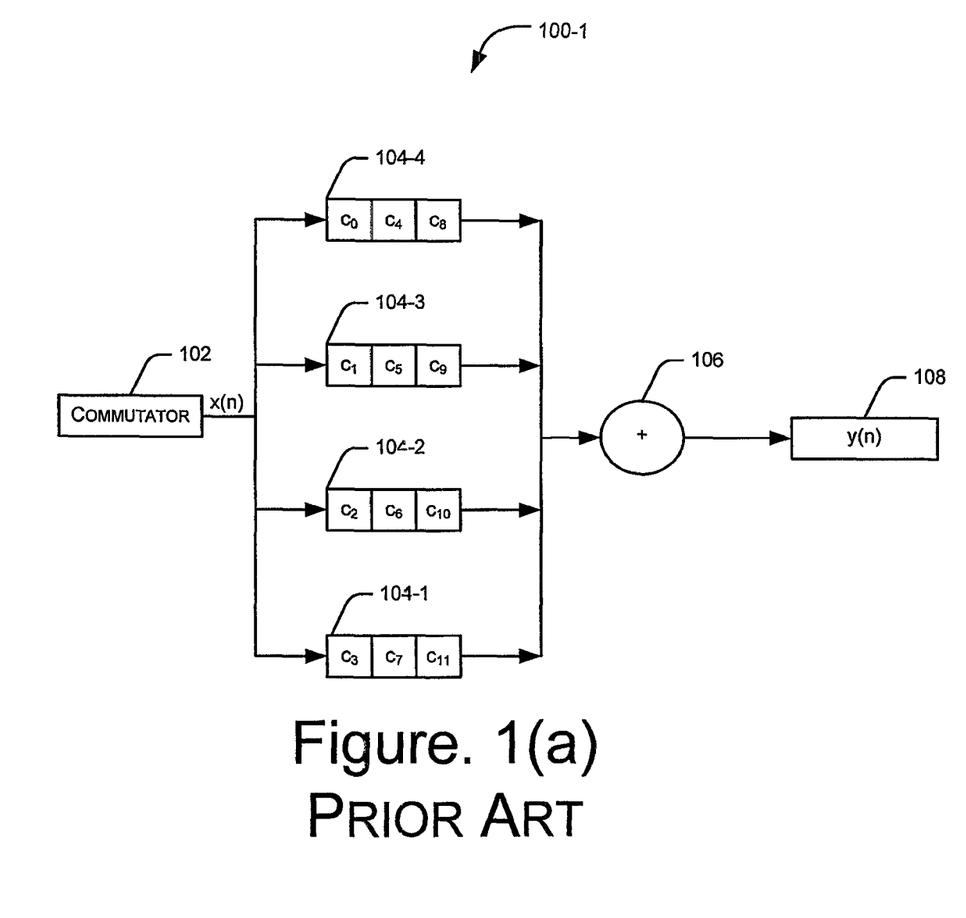
FIG. 1(a) illustrates a conventional implementation of a FIR filter.

FIG. 1(a) illustrates a conventional implementation of a FIR filter 100-1. For purposes of discussion, the FIR filter 100-1 may be considered to be a twelve tap filter. The FIR filter 100-1 comprises a commutator 102 and four memory banks 104-1, 104-2, 104-3, and 104-4. The memory banks 104-1, 104-2, 104-3, and 104-4, henceforth collectively referred to as the memory banks 104, are configured to store the filter coefficients of the FIR filter 100-1. Each of the memory banks 104, thus, stores 3 filter coefficients.

Based on the pattern, the first memory bank 104-1 comprises coefficients which would be multiplied with every fourth input sample starting with the input sample x[0], i.e., $c_3$, $c_7$, and $c_{11}$. Similarly, the second memory bank 104-2 comprises the coefficients which would be multiplied with every fourth input sample starting with the input sample x[1], i.e., $c_2$, $c_6$, and $c_{10}$.

A control circuit (not shown in the figure) of the commutator 102 may be configured to provide the input samples to the memory banks 104. Thus in said implementation, when the first input sample, x[0] is received, the commutator 102 is configured to provide the input sample to the first memory bank 104-1. The input sample x[0] is multiplied with the first coefficient, $c_3$, present in the memory bank 104-1 and the result is transmitted to an adder unit 106. On receiving the second input sample, x[1], the commutator 102 feeds the same to the second memory bank 104-2, and so on. Thus, on receiving four input samples, x[0], . . . , x[3], the adder unit generates the first output, y[3], at an output unit 108, in accordance with the equation 2.

On receiving the fifth input sample, x[4], the commutator 102 feeds the same to the first memory bank 104-1. The previous input sample which was fed to the first memory bank 104-1, i.e., x[0], is now multiplied by the second coefficient stored in the first memory bank 104-1, i.e., $c_7$, and the present input sample, i.e., x[4], is multiplied with the first coefficient, $c_3$, present in the memory bank 104-1 and the result is transmitted to the adder unit 106. On receiving eight input samples, x[0], . . . , x[7], the adder unit generates the second output, y[7], at the output unit 108, in accordance with the equation 3, and so on.

In the said implementation, only those products of the input sample and a filter coefficient, which would be utilized to generate an output sample, are computed, thus reducing the number of computations. Although, this implementation reduces the number of computations as compared to number of computations involved in implementing the FIR filter without the memory banks, the abovementioned implementation of the FIR filter 100-1 requires a high amount of memory since the previous input samples have to be stored. Further, in case the decimation factor or the number of filter coefficients is changed, the memory banks have to be redefined. Moreover, in the said conventional approach, the area of the FIR filter 100-1 increases linearly with the number of taps.

Figure 1B:
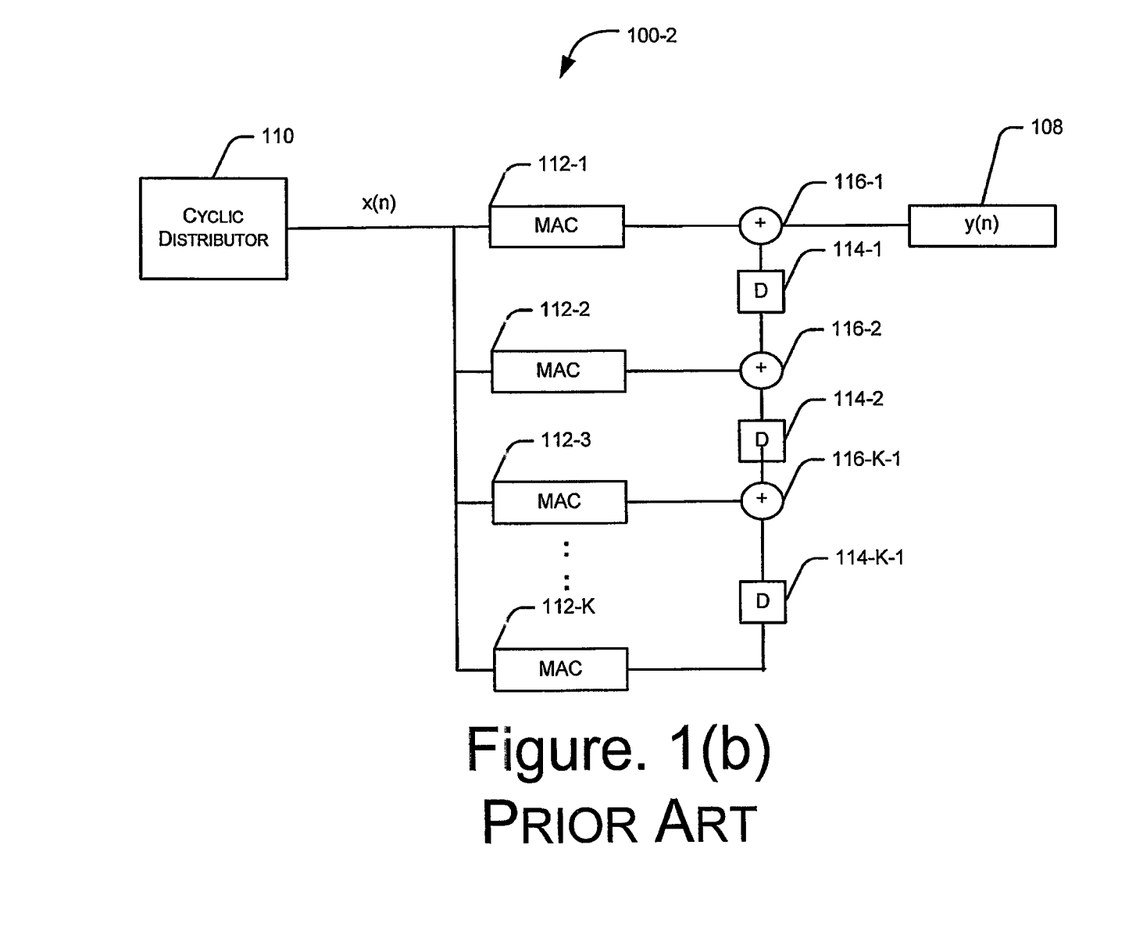
FIG. 1(b) illustrates another conventional implementation of the FIR filter.

FIG. 1(b) illustrates another conventional implementation of the FIR filter 100-2. Said implementation of the FIR filter 100-2 is also known as polyphase filtering. In polyphase filtering technique, the input samples are divided into a plurality of sub-streams, say M sub-streams, by a cyclic distributor 110; wherein M is equal to (N/K). In said implementation, the FIR filter 100-2 includes a plurality, M, of 'multiply and accumulate' (MAC) units 112-1, 112-2, 112-3, . . . 112-M, henceforth collectively referred to as MAC units 112 and singularly as a MAC unit 112. Each of the MAC units 112 is configured to compute the product of each input sample with the corresponding filter coefficient and add the result to a previously stored value in the MAC unit 112. The operation of the FIR filter 100-2 is similar to the operation of M FIR filters, each having K coefficients operating in parallel, i.e., in a polyphase mode. The FIR filter 100-2 utilizes M MAC units 112, wherein the M-$^{th}$ MAC unit 112 computes the partial sum for all the M-$^{th}$ coefficients of the M polyphase filters. In said implementation, the FIR filter 100-2 further includes M−1 delay units, 114-1, 114-2, . . . , 114-K−1 and M−1 adder units, 116-1, 116-2, . . . 116-M−1. The explanation and details of well-known components are omitted for simplicity of the description.

The polyphase filtering technique, as implemented in the FIR filter 100-2, reduces the number of computations involved in downsampling a signal but increases the memory area required for the implementation of the FIR filter 100-2 when compared to the conventional technique described in conjunction with FIG. 1(a). Further, the implementation of the above conventional techniques involve the use of a high number of multiplexer units and a high number of flip flops, which increases the area as well as the power consumption of the implemented circuit.

The present subject matter discloses a system and method of downsampling a signal. The present subject matter is explained in conjunction with the following figures. It should be noted that the description and figures merely illustrate the principles of the present subject matter. It will thus be appreciated that those skilled in the art will be able to devise various arrangements that, although not explicitly described or shown herein, embody the principles of the present subject matter and are included within its spirit and scope. Moreover, all statements herein reciting principles, aspects, and embodiments of the present subject matter, as well as specific examples thereof, are intended to encompass equivalents thereof.

Figure 2A:
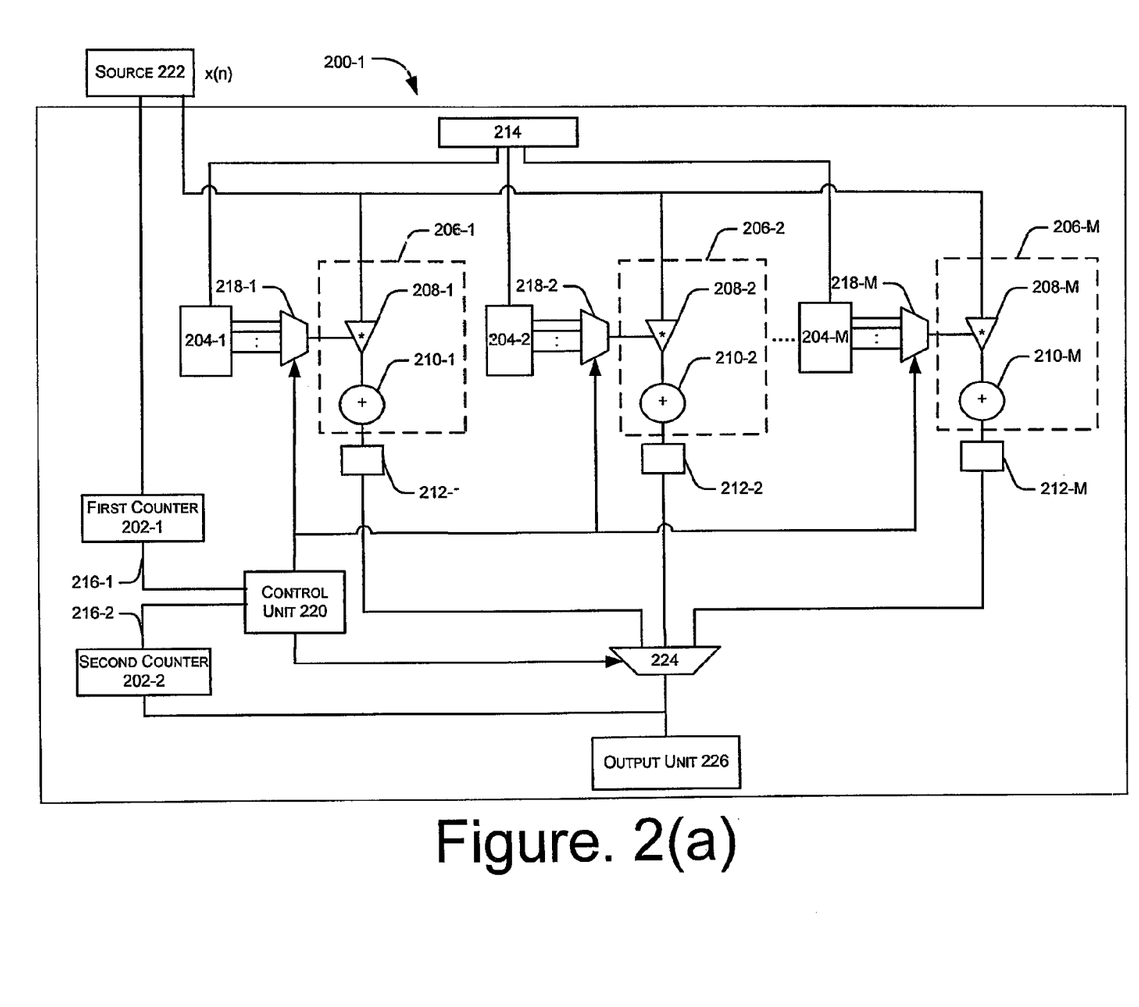
FIGS. 2(a) and 2(b) illustrate an apparatus for signal processing, in accordance with an embodiment of the present subject matter.

It will be appreciated by those skilled in the art that the words during, while, and when as used herein are not exact terms that mean an action takes place instantly upon an initiating action but that there may be some small but reasonable delay, such as a propagation delay, between the initial action, and the reaction that is initiated by the initial action. Additionally, the word "coupled" is used throughout for clarity of the description and can include either a direct connection or an indirect connection. The descriptions and details of well-known components are omitted for simplicity of the description FIG. 2(a) illustrates an apparatus 200-1 for downsampling a signal, in accordance with an embodiment of the present subject matter. In said implementation, the apparatus 200-1 includes a first counter 202-1 and a second counter 202-2, configured to count a number of input samples and output samples, respectively. The counters 202-1 and 202-2 may be implemented as one or more modules which stores the number of times a particular event or process has occurred, usually based on a clock signal. The apparatus 200-1 further includes a plurality of memory banks 204-1, 204-2, . . . , 204-M, collectively referred to as memory banks 204, configured to store a plurality of filter coefficients. The apparatus 200-1 further includes a plurality of MAC units 206-1, 206-2, . . . 206-M, collectively referred to as MAC units 206. Each MAC unit 206 is configured to multiply a filter coefficient with an input sample, add the resultant product to an existing result stored in the MAC unit 206 and store the summation. As depicted, in one implementation, each of the MAC units 206-1, 206-2, . . . 206-M includes a multiplier 208-1, 208-2, . . . 208-M; and an adder 210-1, 210-2, . . . 210-M. Each of the MAC units 206-1, 206-2, . . . 206-M is coupled with a register 212-1, 212-2, . . . 212-M, respectively. The multipliers 208-1, 208-2, . . . 208-M are collectively referred to as multipliers 208 while, in a similar manner, the registers 212-1, 212-2, . . . 212-M are collectively referred to as registers 212. The MAC unit 206 operates in a conventionally known manner, accordingly, the operation of the MAC unit 206 has not elaborated for the sake of brevity of description.

Further, the apparatus 200-1 may be coupled to a memory component 214, hereinafter referred to as memory 214. Example of the memory 214 may comprise various types of memories, such as random access memory (RAM) and read only memory (ROM). In the present implementation, the memory 214 may be configured to store the plurality of filter coefficients and provide the same to each of the memory banks 204. Further, in different embodiments of the present subject matter, the plurality of filter coefficients may either be static coefficients or dynamic coefficients.

Thus, each of the memory banks 204 stores a plurality of filter coefficients and is required to select one of the plurality of filter coefficients for its operation with respect to every input sample. The selection of the filter coefficient is based on the count of number of input samples. In other words, the selection of the filter coefficient is based on the output of the first counter 202-1, also referred to as input count 216-1.

The input count 216-1 provided by the first counter 202-1 is provided to coefficient multiplexers 218-1, 218-2 . . . 218-M, collectively known as coefficient multiplexers 218, coupled with a respective memory bank of the memory banks 204-1, 204-2 . . . 204-M. In one embodiment, the input count 216-1 is provided through a control unit 220. The coefficient multiplexer 218 is configured to select one of the filter coefficients stored in each of the memory banks 204, based on the output of the control unit 220, for multiplying the selected filter coefficient with an input sample. As will be apparent, the output of the control unit 220 provided to the coefficient multiplexer 218 as depicted herein, may be understood to be equivalent to select lines typically implemented by a multiplexer to determine an input to be selected from amongst the several inputs provided to the multiplexer. The output of the control unit 220 may be understood to be indicative of the number of input samples received. In other words, the control unit 220 is configured to select a filter coefficient stored in each of the memory banks 204. For example, the coefficient multiplexer 218-1 may be configured to select the coefficient $c_4$ in the first memory bank 204-1 on receiving the input sample x[0], select the coefficient $c_3$ on receiving the input sample x[1], and so on.

The apparatus 200-1 further comprises a multiplexer unit 224 configured to select a register 212 from amongst the plurality of registers 212 based on the number of output samples counted by the second counter 202-2. The number of output samples counted by the second counter 202-2 is hereinafter referred to as output cycle count 216-2.

In one embodiment, the output cycle count 216-2 is also provided to the control unit 220. The control unit 220 may be configured to select a register 212 from amongst the plurality of registers 212 to provide an output sample. Accordingly, the control unit 220 may in turn generate an output based on which the multiplexer unit 224 selects one of the registers 212. For example, the multiplexer unit 224 may be configured to select the register 212-1 for obtaining the first output sample, select the register 212-2 for obtaining the second output sample and so on in a cyclic order. For example, if the decimation factor of the apparatus 200-1 is K, then one of the registers 212 will be selected for every K input samples. As will be apparent, the output of the control unit 220 provided to the multiplexer unit 224, may be understood to be equivalent to select lines typically implemented by any multiplexer to determine an input to be selected from amongst the several inputs provided to the multiplexer.

In one implementation, the apparatus 200-1 may be assumed to have N number of taps, i.e., N filter coefficients and a decimation factor of K. Thus, the number of memory banks 204 is equal to M wherein M=(N/K). Accordingly, the first memory bank 204-1 stores coefficients from $c_0$ to $c_{k-1}$, the second memory bank 204-2 stores coefficients $c_k$ to $c_{2k-1}$ and the $M^{th}$ memory bank 204-M stores coefficients $c_{N-K}$ to $c_{N-1}$. For the ease of explanation, and for illustrating mathematical equations, the apparatus 200-1 may be assumed to have a decimation factor of 5 and 20 taps. Accordingly, in said example, the apparatus 200-1 has 4 memory banks 204-1, 204-1, 204-1 and 204-M.

In operation, a source 222 feeds the input sample x[n] to the apparatus 200-1. Table 1 depicts the initial configuration of the memory banks 204. As described above, each of the memory banks 204 stores 5 filter coefficients.

TABLE 1

| Memory Bank 204-1 | Memory Bank 204-2 | Memory Bank 204-3 | Memory Bank 204-4 |
|---|---|---|---|
| $c_4$ | $c_9$ | $c_{14}$ | $c_{19}$ |
| $c_3$ | $c_8$ | $c_{13}$ | $c_{18}$ |
| $c_2$ | $c_7$ | $c_{12}$ | $c_{17}$ |
| $c_1$ | $c_6$ | $c_{11}$ | $c_{16}$ |
| $c_0$ | $c_5$ | $c_{10}$ | $c_{15}$ |

At time period t0, the first input sample, x[0], is received from the source 222. The first counter 202-1 initiates a count of the number of input samples received. Based on the number of input samples received, the coefficient multiplexers 218-1, 218-2 . . . 218-M select a filter coefficient in each of the memory banks 204-1, 204-1 . . . 204-M, respectively, which is to be multiplied with the received input sample, x[0]. The MAC units 206 compute the product of the selected filter coefficient with the received input sample, x[0]. Table 2a illustrates the coefficients selected from the memory banks 204 and the state of the respective registers 212-1, 212-2 . . . 212-M, at the instant t0.

TABLE 2a

| Time period | Input Sample | Memory Bank 204-1 | Value Stored in the register 212-1 | Memory Bank 204-2 | Value Stored in the register 212-2 | Memory Bank 204-3 | Value Stored in the register 212-3 | Memory Bank 204-4 | Value Stored in the register 212-4 |
|---|---|---|---|---|---|---|---|---|---|
| t0 | x[0] | $c_4$ | x[0] * $c_4$ | $c_9$ | x[0] * $c_9$ | $c_{14}$ | x[0] * $c_{14}$ | $c_{19}$ | x[0] * $c_{19}$ |

At time period t1, the second input sample x[1] is received. Based on the count maintained by the first counter 202-1, the coefficient multiplexers 218, select a filter coefficient in each of the memory banks 204 which is to be multiplied with the received input sample, x[1]. The MAC units 206 compute the product of the selected filter coefficient with the received input sample, x[1] and add the product to the result present in the corresponding registers 212. Table 2b illustrates the coefficients selected from the memory banks 204 and the state of the registers 212 at the instant t0.

TABLE 2b

| Time period | Input Sample | Memory Bank 204-1 | Value Stored in the register 212-1 | Memory Bank 204-2 | Value Stored in the register 212-2 | Memory Bank 204-3 | Value Stored in the register 212-3 | Memory Bank 204-4 | Value Stored in the register 212-4 |
|---|---|---|---|---|---|---|---|---|---|
| t1 | x[1] | $c_3$ | x[0] * $c_4$ + x[1] * $c_3$ | $c_8$ | x[0] * $c_9$ + x[1] * $c_8$ | $c_{13}$ | x[0] * $c_{14}$ + x[1] * $c_{13}$ | $c_{18}$ | x[0] * $c_{19}$ + x[1] * $c_{18}$ |

At time periods t2, t3 and t4, the input samples x[2], x[3] and x[4] are received respectively and the above described steps are repeated. Since the decimation factor of the apparatus is 5, on completion of receiving of five input samples, the first output, y[4], is generated At the time period t4, the value present in the register 212-1 is equal to $x[0]c_4+x[1]c_3+x[2]c_2+x[3]c_1+x[4]c_0$, which is the value of the first output in accordance with the equation 1 reproduced below for reference.

$$y[n] = \sum_{i=0}^{N-1} x[n-i]c_i \qquad \text{Equation 1}$$

Further the various states of the registers 212 at the end of the time period t4 is depicted in Table 3. In Table 3, the values present in the M-th memory bank, 204-M at the end of time period tq is represented as Value (M,Q).

TABLE 3

| Time period | Value Stored in the register 212-1 [Value (1, 4)] | Value Stored in the register 212-2 [Value (2, 4)] | Value Stored in the register 212-3 [Value (3, 4)] | Value Stored in the register 212-4 [Value (4, 4)] |
|---|---|---|---|---|
| t4 | $x[0]*c_4 + x[1]*c_3 + x[2]*c_2 + x[3]*c_1 + x[4]*c_0$ | $x[0]*c_9 + x[1]*c_8 + x[2]*c_7 + x[3]*c_6 + x[4]*c_5$ | $x[0]*c_{14} + x[1]*c_{13} + x[2]*c_{12} + x[3]*c_{11} + x[4]*c_{10}$ | $x[0]*c_{19} + x[1]*c_{18} + x[2]*c_{17} + x[3]*c_{16} + x[4]*c_{15}$ |

In general, the value stored in any of the registers 212 may be represented by equation 4 given below. In the equation 4, PO represents the value stored in the register 212, m is any integer equal to or between 1 and M, as represented by equation 5, and S represents the $s^{th}$ output sample. As would be understood by those skilled in the art, S will be greater than or equal to zero. Thus, the output, at the end of every $K^{th}$ input sample is y[S], as is represented by equation 6.

$$PO[m, S] = \sum_{i=0}^{K-1} x_{SK+i} c_{((m+(M-1)S)_M)K-1-i}$$ Equation 4

$$1 \leq m \leq M$$ Equation 5

$$y(S) = \sum_{s=0}^{S} P_{(S+1)_M, s}$$ Equation 6

On the generation of the first output as explained above, multiplexer unit 224 transmits the same to an output unit 226. In one implementation, as explained previously, the multiplexer unit 224 is configured to select a register 212 from amongst the plurality of registers 212, based on the output of the control unit 220. The control unit 220 may accordingly couple the selected registers 212 to the output unit 226, through the multiplexer unit 224, every $K^{th}$ input cycle.

Further, as explained previously, the second counter 202-2, upon receiving 5 input samples, also increases the stored count. Accordingly, an incremented output cycle count 216-2 is generated. Based on the output cycle count 216-2, the memory banks 204 get updated. In other words, a cyclic rotation in the contents of each of the plurality of memory banks 204 occurs. Thus, the coefficients, $c_{(M-1)-K}, \ldots, c_{MK-1}$ associated with the memory bank 204-M may now be associated with memory bank 204-1, and so on. Further, since the shifting of the filter coefficients does not occur in memory space of the memory banks 204, the apparatus 200-1 has low peak power consumption. In one embodiment, the control unit 220 may be coupled with each of the memory banks 204 and may be configured to rotate the memory banks 204 in a cyclic order, i.e., the association of the memory banks 204 and the coefficient multiplexers 218 change in a cyclic order.

Hence, in case of M memory banks, the order of memory banks after time period tk would be 204-M, 204-1,
204-2, . . . , 204-M–1. Table 4 depicts the order of the memory banks 204 after the time period t4.

TABLE 4

| Memory Bank 204-4 | Memory Bank 204-1 | Memory Bank 204-2 | Memory Bank 204-3 |
|---|---|---|---|
| $c_{19}$ | $c_4$ | $c_9$ | $c_{14}$ |
| $c_{18}$ | $c_3$ | $c_8$ | $c_{13}$ |
| $c_{17}$ | $c_2$ | $c_7$ | $c_{12}$ |
| $c_{16}$ | $c_1$ | $c_6$ | $c_{11}$ |
| $c_{15}$ | $c_0$ | $c_5$ | $c_{10}$ |

The register from which the output was obtained is reset or value stored in the register is erased. Thus, in said implementation, the register 212-1 is reset to NULL after the output is read from the register. At time period t5, the sixth input sample is received. Based on the input count 216-1 generated by the first counter 202-1, the coefficient multiplexers 218 selects a filter coefficient in each of the memory banks 204 which is to be multiplied with the received input sample, x[5]. The filter coefficients now selected by the respective coefficient multiplexers 218 correspond to the updated order of memory banks 204. The MAC units 206 compute the product of the selected filter coefficient with the received input sample, x[5], and add the product to the result present in the corresponding register 212. Table 5 illustrates the coefficients selected from the memory banks 204 and state of the registers 212 at the instant t5.

TABLE 5

| Time period | Input Sample | Memory Bank 204-4 | Value Stored in the register 212-1 | Memory Bank 204-1 | Value Stored in the register 212-2 | Memory Bank 204-2 | Value Stored in the register 212-3 | Memory Bank 204-3 | Value Stored in the register 212-r |
|---|---|---|---|---|---|---|---|---|---|
| t5 | x[5] | $c_{19}$ | $x[5]*c_{19}$ | $c_4$ | Value (2, 4) + $x[5]*c_9$ | $c_9$ | Value (3, 4) + $x[5]*c_{14}$ | $c_{14}$ | Value (4, 4) + $x[5]*c_{19}$ |

Similarly, at time periods t6, t7, t8 and t9, the input samples, x[6], x[7], x[8] and x[9] are received. Based on the input count 216-1 of the first counter 202-1, the coefficient multiplexers 218 select the corresponding filter coefficient in each of the memory banks 204. The MAC units 206 compute the product of the selected filter coefficient with the received input sample, adds the product to the previously stored result in the corresponding registers 212 and stores the summation in the corresponding registers 212. Based on the decimation factor of the apparatus 200-1, on completion of ten time periods, the second output is generated. At the time period t9, the value present in the register 212-2 is equal to: $x[5]*c_4+x[6]*c_3+x[7]*c_2+x[8]*c_1+x[9]*c_0+$Value (2,4). By replacing the value of Value(2,4) from Table 3; the following value is obtained: $x[0]*c_9$ $x[1]*c_8+x[2]*c_7$ $x[3]*c_6+x[4]*c_5+x[5]*c_4+x[6]*c_3+x[7]*c_2+x[8]*c_1+x[9]*c_0$, which is the value of the second output in accordance with the equation 1 reproduced below for reference.

$$y[n] = \sum_{i=0}^{N-1} x[n-i]c_i \qquad \text{Equation 1}$$

On the generation of the second output, the multiplexer unit 224 transmits the same to the output unit 226. Further, the second counter 202-2 also increments the output cycle count 216-2. On a change in the output cycle count 216-2, the control unit 220 shifts each of the plurality of memory banks 204 in a cyclic order; i.e. the association of the memory banks 204 and the MAC units 206 are changed in a cyclic order. Thus, the new order of the memory banks becomes 204-3, 204-4, 204-1, and 204-2. Hence, in case of M memory banks, the order of memory banks after time period $t_{k+1}$ would be 204-M-1, 204-M, 204-1, 204-2, ..., 204-M-2.

Thus in general, for a decimation factor of K and for M memory banks 204, Table 6 depicts the order of the memory banks at every $K^{th}$ time period.

TABLE 6

| Time period | Order of memory banks |
|---|---|
| t0 ... tk - 1 | 204-1, 204-2, 204-3, ... 204-M |
| tk ... t2k - 1 | 204-M, 204-1, 204-2, 204-3, ... 204-M-1 |
| t2k ... t3k 1 | 204-M-1, 204-M, 204-1, 204-2, 204-3, ... 204-M-2 |
| t(M - 1)k ... tMk - 1 | 204-1, 204-2, 204-3, ... 204-M |

Thus, the apparatus 200-1 reduces the number of flip flops and adder units required to implement the downsampling of a signal. The apparatus 200-1 also reduces the memory area as past input samples are not stored. Further, in case of increase in filter length, i.e., increase in number of taps, the area of the apparatus 200-1 increases logarithmically and not linearly as in conventionally known techniques. Also, compared to conventionally known FIR filters, in the present implementation, there is no shifting of filter coefficients in the registers 212, and therefore, the present implementation saves power. Further, each register 212 and MAC unit 206 performs computations that are temporally distributed, thereby reducing peak power.

Moreover, the short critical path of the apparatus 200-1 facilitates the usage of the apparatus 200-1 in high frequency operation. Also, in case, of change in decimation ratio, the apparatus 200-1 may be reused as only the number of memory banks 204 to be used, the number of filter coefficients stored in each memory bank 204, i.e., K, and the configuration of the control unit 220 would change. In an example, if the decimation factor is increased, the apparatus 200-1 need not be re-designed. It may be used based on the new configuration with the redundant memory banks turned off. Further, since, the apparatus 200-1 has lesser number of components; the apparatus 200-1 has low power consumption facilitating its usage in various portable electronic devices. It would be appreciated by those skilled in the art, that the apparatus 200-1 may also be made a part of the architecture of any processor configured for digital signal processing, i.e., DSP processor.

Figure 2B:
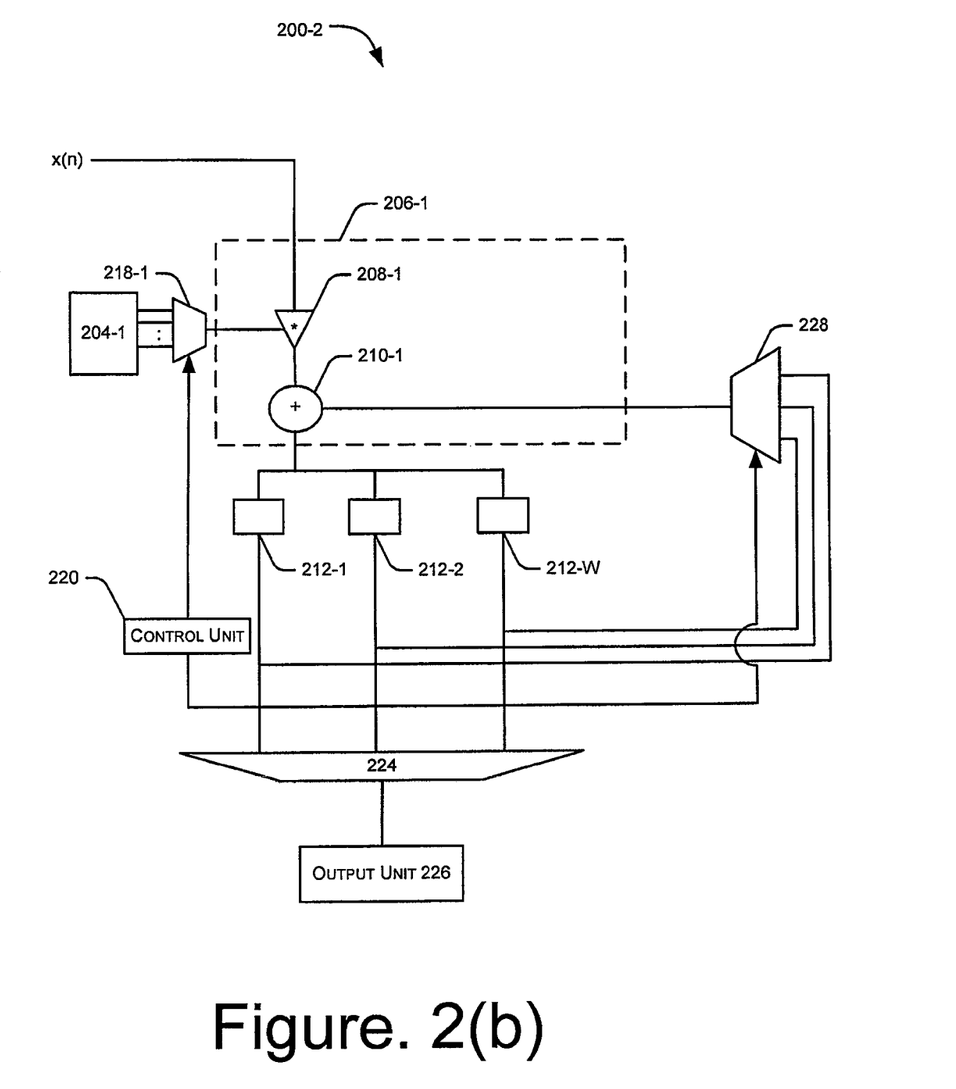

FIG. 2(b) illustrates the apparatus 200-2, in accordance with another embodiment of the present subject matter. In said implementation, the apparatus 200-2 may be implemented in a system whose system clock cycle has a higher frequency than the frequency of the input samples of the apparatus 200-2. For the sake of explanation, it is assumed that one input sample time period is equal to W system clock cycles of the system.

In said implementation, the apparatus 200-2 reduces the number of MAC units 206 and memory banks 204 by a factor of R, wherein R=CEIL(M/W), where CEIL refers to the next higher integer value function. In said implementation, each memory bank 204 is associated with W registers, 212-1, 212-2, ... 212-W. Thus, if there are 4 system clock cycles in one input sample time period, the number of MAC units 206 and memory banks 204 would be reduced by a factor of 4 rounded off to the next integer. For example, say in one implementation, the apparatus 200-2 has N filter coefficients, and has a decimation factor of K. If there are W system cycles in each input sample time period, then the number of memory banks would be CEIL(M/W), such that N=K×M. In the said example, at time period t0, the memory bank 204-1 would have the coefficients $c_{(K-1)}$, $c_{(2K-1)}$, $c_{(3K-1)}$, ..., and $c_{(MK-1)}$. Similarly, at the $K^{th}$ input sample time period, the memory bank 204-1 would have the filter coefficients $c_0$, $C_K$, $c_{2K}$, ... $c_{K(M-1)}$.

For the ease of explanation, and for illustrating mathematical equations, consider an apparatus having a decimation factor of 4 and 16 taps. Accordingly, the apparatus 200-1 would have 4 memory banks 204-1, 204-2, 204-3, and 204-4. As mentioned earlier, in accordance with the present implementation, the number of MAC units 206 and memory banks 204 would be reduced by a factor of the number of system cycles rounded off to the next integer. Thus in the present example, for apparatus 200-2, if it is assumed that there are 4 system clock cycles in every input sample time period, then the number of memory banks that has to be implemented would be one.

In said implementation, the basis of storing filter coefficients in the memory banks 204 is different than as explained previously for apparatus 200-1. In said implementation, in the first input sample time period, the memory bank 204-1 may be configured to store filter coefficients $c_3$, $c_7$, $c_{11}$, and $c_{15}$. Similarly, at the second input sample time period, the memory bank 204-1 may be configured to store filter coefficients $c_2$, $c_6$, $c_{10}$, and $c_{14}$, and so on.

At time period t0, the first input sample, x[0], is received from the source 222. The first counter 202-1 stores the number of input samples received. Based on the number of system clock cycles, the coefficient multiplexer 218-1 selects a filter coefficient in the memory bank 204-1 which is to be multiplied with the received input sample, x[0]. The MAC unit 206-1 computes the product of the selected filter coefficient with the received input sample, x[0] stores the result in the register 212-1. Table 7a depicts the status of the memory bank 204-1 and the register 212-1.

TABLE 7a

| Time period | System Clock Cycle Number | Input Sample | Selected Filter coefficient of the Memory Bank 204-1 | Value Stored in the register 212-1 |
|---|---|---|---|---|
| t0 | 1 | x[0] | $c_3$ | x[0] * $c_3$ |

In the next system clock cycle, the coefficient multiplexer 218-1 selects a second filter coefficient in the memory banks 204-1 which is to be multiplied with the received input sample, x[0]. The MAC unit 206-1 computes the product of the selected filter coefficient with the received input sample, x[0] stores the result in the register 212-2. Table 7b depicts the status of the memory bank 204-1 and the register 212-2.

TABLE 7b

| Time period | System Clock Cycle Number | Input Sample | Selected Filter coefficient of the Memory Bank 204-1 | Value Stored in the register 212-2 |
|---|---|---|---|---|
| t0 | 2 | x[0] | $c_7$ | x[0] * $c_7$ |

Similarly, in the next system clock cycle, i.e., the third system cycle, the coefficient multiplexer 218-1 selects a third filter coefficient in each of the memory banks 204 which is to be multiplied with the received input sample, x[0]. The MAC unit 206-1 computes the product of the selected filter coefficient with the received input sample, x[0] stores the result in the register 212-3. Table 7c depicts the status of the memory bank 204-1 and the register 212-3.

TABLE 7c

| Time period | System Clock Cycle Number | Input Sample | Selected Filter coefficient of the Memory Bank 204-1 | Value Stored in the register 212-3 |
|---|---|---|---|---|
| t0 | 3 | x[0] | $c_{11}$ | x[0] * $c_{11}$ |

Accordingly, in the fourth clock cycle, the value stored in the register 212-4 would be x[0]*$c_{15}$. Since there are four clock cycles per input time period, the fifth clock cycle will correspond to the next input time period.

At time period t1, the second input sample, x[1], is received from the source 222. On receiving the second input sample, the count of input samples maintained by the first counter (not shown in figure) is increased. The first counter 202-1 generates the input count 216-1 which is received by the control unit 220. The control unit 220 is configured to generate select signals for the coefficient multiplexer 218-1. In another implementation, the control unit 220 may be configured to generate select signals for the coefficient multiplexer 218-1 based on the number of system clock cycles elapsed. Based on the select signals, the coefficient multiplexer 218-1 selects a filter coefficient in the memory bank 204-1 which is to be multiplied with the received input sample, x[1]. The MAC unit 206-1 computes the product of the selected filter coefficient with the received input sample, x[1] stores the result in the register 212-1. Table 7d depicts the status of the memory bank 204-1 and the register 212-1.

TABLE 7d

| Time period | System Clock Cycle Number | Input Sample | Selected Filter coefficient of the Memory Bank 204-1 | Value Stored in the register 212-1 |
|---|---|---|---|---|
| t1 | 15 | x[1] | $c_2$ | X[1] * $c_2$ + X[0] * $c_3$ |

Thus, at the end of four input sample time periods, i.e., after 16 system clock cycles, the value stored on the register 212-1 would be x[3]*$c_0$+x[2]*$c_1$+x[1]*$c_2$+x[0]*$c_3$, which is the value of the first output. In one implementation, based on the selection logic implemented using select signals by the control unit 220, the multiplexer unit 221 determines the register 212 from which the output value is to be obtained and subsequently transmitted to the output unit 226.

In another implementation, the number of system clock cycles may be different from the decimation factor of the apparatus 200-2. For example, say in the above described scenario, the number of system clock cycles, W, available in each input sample time period is 3. Then, the number of memory banks that may be utilized to implement the apparatus 200-2 is (4/3) rounded off to the next integer, i.e., 2. Thus in the said example, the apparatus 200-2 would include two memory banks, namely the first memory bank 204-1 and the second memory bank 204-2, each having 3 registers 212. In one implementation, both the first memory bank 204-1 and the second memory bank 204-2 may include all the sixteen filter coefficients; whereas in another implementation, the filter coefficients may be written in each of the first memory bank 204-1 and the second memory bank 204-2 after each output cycle.

In said implementation, the Table 8 below represents the selection of filter coefficients for the memory banks 204-1 and 204-2. As depicted in the Table 8, after every four input samples, i.e., after each output sample time period, the contents of each of the plurality of memory hanks 204 are shifted in a cyclic order.

TABLE 8

| Input sample time period | System Clock Cycle Number | Input Sample | Coefficients stored in the memory bank 204-1 | Selected Coefficient from the memory bank 204-1 | Coefficients stored in the memory bank 204-2 | Selected Coefficient from the memory bank 204-2 |
|---|---|---|---|---|---|---|
| 1 | 1 | x[0] | $c_3, c_7, c_{11}$ | $c_3$ | $c_{15}$ | $c_{15}$ |
| 1 | 2 | x[0] | $c_3, c_7, c_{11}$ | $c_7$ | $c_{15}$ | Redundant |
| 1 | 3 | x[0] | $c_3, c_7, c_{11}$ | $c_{11}$ | $c_{15}$ | Redundant |
| 2 | 4 | x[1] | $c_2, c_6, c_{10}$ | $c_2$ | $c_{14}$ | $c_{14}$ |
| 2 | 5 | x[1] | $c_2, c_6, c_{10}$ | $c_6$ | $c_{14}$ | Redundant |
| 2 | 6 | x[1] | $c_2, c_6, c_{10}$ | $c_{10}$ | $c_{14}$ | Redundant |

TABLE 8-continued

| Input sample time period | System Clock Cycle Number | Input Sample | Coefficients stored in the memory bank 204-1 | Selected Coefficient from the memory bank 204-1 | Coefficients stored in the memory bank 204-2 | Selected Coefficient from the memory bank 204-2 |
|---|---|---|---|---|---|---|
| 3 | 7  | x[2] | $c_1, c_5, c_9$    | $c_1$    | $c_{13}$ | $c_{13}$ |
| 3 | 8  | x[2] | $c_1, c_5, c_9$    | $c_5$    | $c_{13}$ | Redundant |
| 3 | 9  | x[2] | $c_1, c_5, c_9$    | $c_9$    | $c_{13}$ | Redundant |
| 4 | 10 | x[3] | $c_0, c_4, c_8$    | $c_0$    | $c_{12}$ | $c_{12}$ |
| 4 | 11 | x[3] | $c_0, c_4, c_8$    | $c_4$    | $c_{12}$ | Redundant |
| 4 | 12 | x[3] | $c_0, c_4, c_8$    | $c_8$    | $c_{12}$ | Redundant |
| 5 | 13 | x[4] | $c_{15}, c_3, c_7$ | $c_{15}$ | $c_{11}$ | $c_{11}$ |

The MAC unit 206-1 adds the product of the input sample and the selected filter coefficient to a value already stored in the selected register; and stores the summation in the selected register 212. In one implementation, a register selection multiplexer unit 228 may be configured to select the register 212 in which the values computed by the MAC unit 206-1 is to be stored, based on a count of system clock cycles. For example, in the first system clock cycle, the register 212-1 would be selected, in the second clock cycle; the register 212-2 would be selected and so on. Thus, in the first system clock cycle, the MAC 206-1 retrieves a value already present in the register 212-1 and adds the product $x[0]*c_3$ to the value, if any, already stored in the register 212-1 and stores the summation in the register 212-1. Moreover, since each data shift and multiply-accumulate operation are temporally distributed, i.e., occurs at different phases of clock, it reduces the peak power consumption of the apparatus 200-2.

In accordance with the description provided in context of FIG. 2(a), it will be understood that the present implementation will further reduce the number of MAC units 206 to be used for the same decimation factor and the same number of taps. In the said implementation, the apparatus 200-2 further reduces the memory area and the number of MAC units 206, thus reducing power consumption. Moreover, the apparatus 200-2 also facilitates arbitrary integral multiple decimation ratios. Based on constraints of clock cycle budgeting and the lowest decimation ratio desired, the apparatus 200-2 can be designed for a worst case scenario. Such a design will support all integral ratios higher than the lowest worst case ratio. For example in a design problem involving decimate by 6, 10, and 11, the apparatus 200-2 (MAC, MUXes, counters, etc) designed for decimate by 6 will accommodate the higher ratios by altering the control values. The basic structure will remain the same and may be reused. Further, those skilled in the art would appreciate that the apparatuses 200-1 and 200-2 may also be implemented as signal processing units and/or signal processing circuits in various communication devices.

Although embodiments of the apparatus for signal processing have been described in language specific to structural features and/or methods, it is to be understood that the subject matter described herein is not necessarily limited to the specific features or methods described. Rather, the specific features and methods are disclosed as exemplary implementations for the apparatus for signal processing.

We claim:

1. An apparatus comprising:
one or more memory banks, wherein each memory bank is configured to store a plurality of filter coefficients;
one or more coefficient multiplexer units, each coefficient multiplexer unit being associated with a memory bank from among the one or more memory banks, wherein the each coefficient multiplexer unit is configured to retrieve a filter coefficient from among the plurality of filter coefficients stored in the associated memory bank based in part on a number of received input samples;
one or more multiply and accumulate (MAC) units, each MAC unit being associated with a respective coefficient multiplexer unit from among the one or more coefficient multiplexer units and each MAC unit being further associated with one or more registers from among a plurality of registers, wherein the each MAC unit is configured to:
determine a product of the retrieved filter coefficient with an input sample,
retrieve a previous value stored in an associated register selected from the one or more registers,
compute an addition of the previous value and the product of the retrieved filter coefficient with the input sample, and
store a summation value of the addition in the associated register;
an output multiplexer unit configured to:
select a register from among the one or more registers, based on at least one of the number of input samples and a number of output samples, and
provide the value stored in the register as an output; and
a control unit configured to control an association of each of the one or more memory banks with a MAC unit among the one or more MAC units, based on at least one of the number of received input samples, the number of output samples, and a number of system clock cycles in an input sample time period, and wherein said control unit changes in cyclic order the association of a MAC unit and a memory bank and retrieves in cyclic order the filter coefficients.

2. The apparatus as claimed in claim 1, further comprising a register selection multiplexer unit configured to select a register from among the one or more registers, wherein the selected register stores the summation computed by the MAC unit.

3. The apparatus as claimed in claim 1, further comprising a first counter to determine the number of received input samples and a number of elapsed system clock cycles.

4. The apparatus as claimed in claim 1, further comprising a second counter to determine the number of output samples.

5. The apparatus as claimed in claim 1, wherein the apparatus further comprising a register selection multiplexer unit configured to select a register from among the one or more registers; and wherein the selected register is configured to store the summation of a previous value stored in the selected register and the product of the retrieved filter coefficient with the input sample.

6. The apparatus as claimed in claim 1, wherein the number of the one or more memory banks is based on a decimation factor of the apparatus.

7. The apparatus as claimed in claim 1, wherein the number of the one or more memory banks is based on a number of system clock cycles in an input sample time period.

8. A method of signal processing, the method comprising;
storing a plurality of filter coefficients in one or more memory banks based in part on at least one of a decimation factor, a number of filter coefficients, and a number of system clock cycles per input sample time period;
selecting a filter coefficient from among each of the one or more memory banks based on a number of input samples;
computing a product of the selected filter coefficient with a received input sample;
selecting a register based in part on at least one of a number of input samples and a number of output samples, wherein the selected register stores the value of a future output sample;
retrieving a previous value stored in the selected register;
determining a summation of the previous value and the computed product;
storing the summation in the selected register;
controlling an association of each of the one or more memory banks with a multiply and accumulate (MAC) unit based in part on at least one of a number of input samples, a number of output samples, and a number of system clock cycles; and
changing in cyclic order the association of a MAC unit and a memory bank and retrieving in cyclic order the filter coefficients.

9. The method as claimed in claim 8, further comprising determining the number of at least one of received input samples and output samples.

10. The method as claimed in claim 8, further comprising determining the number of system clock cycles.

11. An apparatus comprising:
one or more memory banks, wherein each memory bank is configured to store a plurality of filter coefficients;
one or more coefficient multiplexer units, each coefficient multiplexer unit being associated with a memory bank from among the one or more memory banks, wherein the each coefficient multiplexer unit is configured to retrieve a filter coefficient from among the plurality of filter coefficients stored in the associated memory bank based in part on a number of received input samples;
one or more multiply and accumulate (MAC) units, each MAC unit being associated with a respective coefficient multiplexer unit from among the one or more coefficient multiplexer units and the each MAC unit being further associated with one or more registers from among a plurality of registers; and
a control unit configured to control an association of each of the one or more memory banks with a MAC unit among the one or more MAC units, based on at least one of the number of received input samples, the number of output samples, and a number of system clock cycles in an input sample time period, and said control unit changes in cyclic order the association of a MAC unit and a memory bank and retrieves in cyclic order the filter coefficients.

12. The apparatus as in claim 11, wherein the each MAC unit is configured to:
determine a product of the retrieved filter coefficient with an input sample;
retrieve a previous value stored in an associated register selected from the one or more registers;
compute an addition of the previous value and the product of the retrieved filter coefficient with the input sample; and
store a summation value of the addition in the associated register.

13. The apparatus as in claim 11, further comprising an output multiplexer unit configured to:
select a register from among the one or more registers, based on at least one of the number of input samples and a number of output samples; and provide the value stored in the register as an output.

14. The apparatus as claimed in claim 11, further comprising a register selection multiplexer unit configured to select a register from among the one or more registers, wherein the selected register stores the summation computed by the MAC unit.

15. The apparatus as claimed in claim 11, further comprising a first counter to determine the number of received input samples and a number of elapsed system clock cycles.

16. The apparatus as claimed in claim 11, further comprising a second counter to determine the number of output samples.

17. The apparatus as claimed in claim 11, further comprising a register selection multiplexer unit configured to select a register from among the one or more registers; and wherein the selected register is configured to store the summation of a previous value stored in the selected register and the product of the retrieved filter coefficient with the input sample.

18. The apparatus as claimed in claim 11, wherein the number of the one or more memory banks is based in part on at least one of a decimation factor of the apparatus and a number of system clock cycles in an input sample time period.

* * * * *